United States Patent [19]

Novak et al.

[11] Patent Number: 5,376,502
[45] Date of Patent: Dec. 27, 1994

[54] PHOTOGENERATED CONDUCTING ORGANIC POLYMERS

[75] Inventors: Bruce M. Novak, El Sobrante; Edward H. Haagen, Fairfax; Anand Viswanathan, Rancho Palo Verdes, all of Calif.

[73] Assignee: Regents of the University of California, Oakland, Calif.

[21] Appl. No.: 881,870

[22] Filed: May 12, 1992

Related U.S. Application Data

[63] Continuation-in-part of Ser. No. 575,529, Aug. 30, 1990, abandoned.

[51] Int. Cl.$^5$ .............................................. C08G 75/14
[52] U.S. Cl. .................................... 430/270; 525/389; 525/537; 525/535; 430/311; 430/494
[58] Field of Search ................ 525/389, 537, 535; 430/270, 311, 494

[56] References Cited

FOREIGN PATENT DOCUMENTS 9204396  3/1992  WIPO ................................. 525/537

OTHER PUBLICATIONS

Novak, Bruce M., et al.; "Photodoped Conducting Polymers;" *Polymer Preprints* vol. 31, No. 2, Aug. 8, 1990; pp. 482–483.
Shacklette, R. L. et al. "Conducting complexes of polyphenylene sulfides", *Chem. Phys.* 75:1919–1927 Aug./1981.
Crivello, J. V. et al. Mar./(1980) *J. Polym. Sci. Polym. Chem. Ed.*, 18:2677–2695, "Complex Triarylsulfonium Salt Photoinitiators. I. The Identification, Characterization, and Synthesis of a New Class of Triarylsulfonium Salt Photoinitiators".
Frommer, J. E. et al. (1983) *J. Polym. Sci. Polym. Chem. Ed.*, 21:39–44, "Arsenic Trifluoride–Arsenic Pentafluoride Synergism in the Formation of Electrically Conductive Poly(p–Phenylene Sulfide)".

*Primary Examiner*—John Kight, III
*Assistant Examiner*—Rachel Johnson
*Attorney, Agent, or Firm*—Flehr, Hohbach, Test, Albritton & Herbert

[57] ABSTRACT

Photoactive cationic organic polymers are provided which are electrically insulating and which are capable of photolysis to an electrically conductive form. The organic polymer includes a C-A linkage, wherein C is a chalcogenide-sulfide, selenide or telluride-in the polymer backbone chain and A is in aryl or alkyl group. The C-A linkage is capable of being cleaved in the presence of ultraviolet light to release A as a free radical and cause the polymer to become electrically conducting in the presence of the light while the remainder of the polymer remains electrically non-conducting. A thin film of such a polymer containing an electrically insulating region and a photolysed electrically conductive region may be used as a semiconductor. Methods for forming photoactive arylated or alkylated poly(phenylene chalcogenide) polymers involving the step of direct arylation or alkylation of a poly(phenylene chalcogenide) polymer are also provided. In addition, a method is provided for forming a semiconductor. The method involves the steps of selectively exposing at least one region of a photoactive electrically insulating cationic organic polymer to photolytic light to release a radical and convert the exposed region to a stable electrically conducting state.

16 Claims, 1 Drawing Sheet

PHOTOGENERATED CONDUCTING ORGANIC POLYMERS

This is a continuation-in-part of co-pending U.S. patent application Ser. No. 07/575,529, filed Aug. 30, 1990 now abandoned.

BACKGROUND OF THE INVENTION

Technological leaps in the electronics industry are often preceded by advances in the art of miniaturization. The desire to pack more information and device features into smaller and smaller spaces has always been a premier driving force in the semiconductor and computer industries. Among the myriad of issues involved in miniaturization is the development of methods for writing very thin lines or electrical circuits onto the surface of a substrate. The questions then become what kind of "pencil" can be used to draw lines which are less than a millionth of a meter wide, and what kind of "paper" do you write on using this "pencil"? For theoretical reasons the "pencil of choice" is light. For a material to then act as the "paper", it must interact with light and undergo some physical change which can then be exploited later on to form the conducting circuitry.

The modern microlithographic process can be illustrated using a positive photoresist material. Microchip circuits are currently formed by applying a thin film of a polymer called a photoresist to the surface of a silicon dioxide coated, silicon wafer. A photoresist is a polymer which is designed to specifically undergo a change in solubility upon exposure to light. The photoresist layer is then masked (selected regions protected from light) to expose only the incipient circuit pattern and photolyzed. The photolyzed regions become more soluble and are selectively washed away to expose the underlying silicon oxide layer while the unexposed regions remain behind. The silicon oxide is then etched to bare the conducting silicon underneath. Finally, the remaining photoresist is stripped away and the result is a wafer possessing conducting circuits etched into its surface. Although successful, this process of drawing electrical circuits is quite protracted and requires numerous processing steps. It would be desirable to design polymeric materials which can be converted directly into conductors upon exposure to light.

SUMMARY OF THE INVENTION

In accordance with the present invention, a photoactive cationic organic polymer is formed which is electrically insulating and which is capable of photolysis to an electrically conductive form, preferably in the presence of ultra-violet light in the absence of the hydrogen donor source. The absence of hydrogen atoms during photolysis is not always a prerequisite for obtaining conductivity and in some instances the polymer of the invention should also be photoactive to an electrically conductive form upon exposure to visible light. More specifically, the structure of the organic polymer includes a C-A linkage, wherein C is a chalcogenide-sulfide, selenide or telluride-in the polymer backbone chain and A is in aryl or alkyl group. The C-A linkage is capable of being cleaved in the presence of ultraviolet light to release A as a free radical and cause the polymer to become electrically conducting in the presence of the light while the remainder of the polymer remains electrically non-conducting. A cationic organic polymer of this invention will decompose upon photolysis to yield a new conjugate polymer that possesses radical cations along its backbone. The polymers of this invention all possess unsaturated polymer chains (ethylene, butadiene, aryl, etc.) adjacent to a cationic chalcogenide. Suitable polymers include alkylated or arylated chalcogenide containing cationic polymers such as alkylated or arylated soluble polydibenzylthiophenes, polyvinylidene sulfides, polyvinylene sulfides or polyphenylene sulfides and derivatives thereof. A preferred polymer is an arylated poly(phenylene sulfide) (APPS) cationic polymer. Unlike its parent, unsubstituted poly(phenylene sulfide) (PPS) it is soluble in common solvents at room temperature and is photoactive.

This unique photoactive behavior suggests that these polymers may find application as photoresist materials for microlithographic materials.

These polymers can be used as either positive or negative resists depending on the choice of post-photolysis processing conditions. In addition, these materials appear to behave as "photodoped" electrically conducting polymers upon photolysis. In combination with common microlithographic techniques, we envision that materials of this type may find great utility in the fabrication of novel, conducting polymeric circuit boards. For example, thin films composed of these polymers could be masked, exposing only the desired electrical circuit pattern. Photolysis and removal of the mask would then yield a polymeric film electrically conducting in the regions photolyzed, and insulator in the unphotolyzed regions.

DETAILED DESCRIPTION OF THE PREFERRED EMBODIMENT

General Synthesis Scheme

Figure 1:
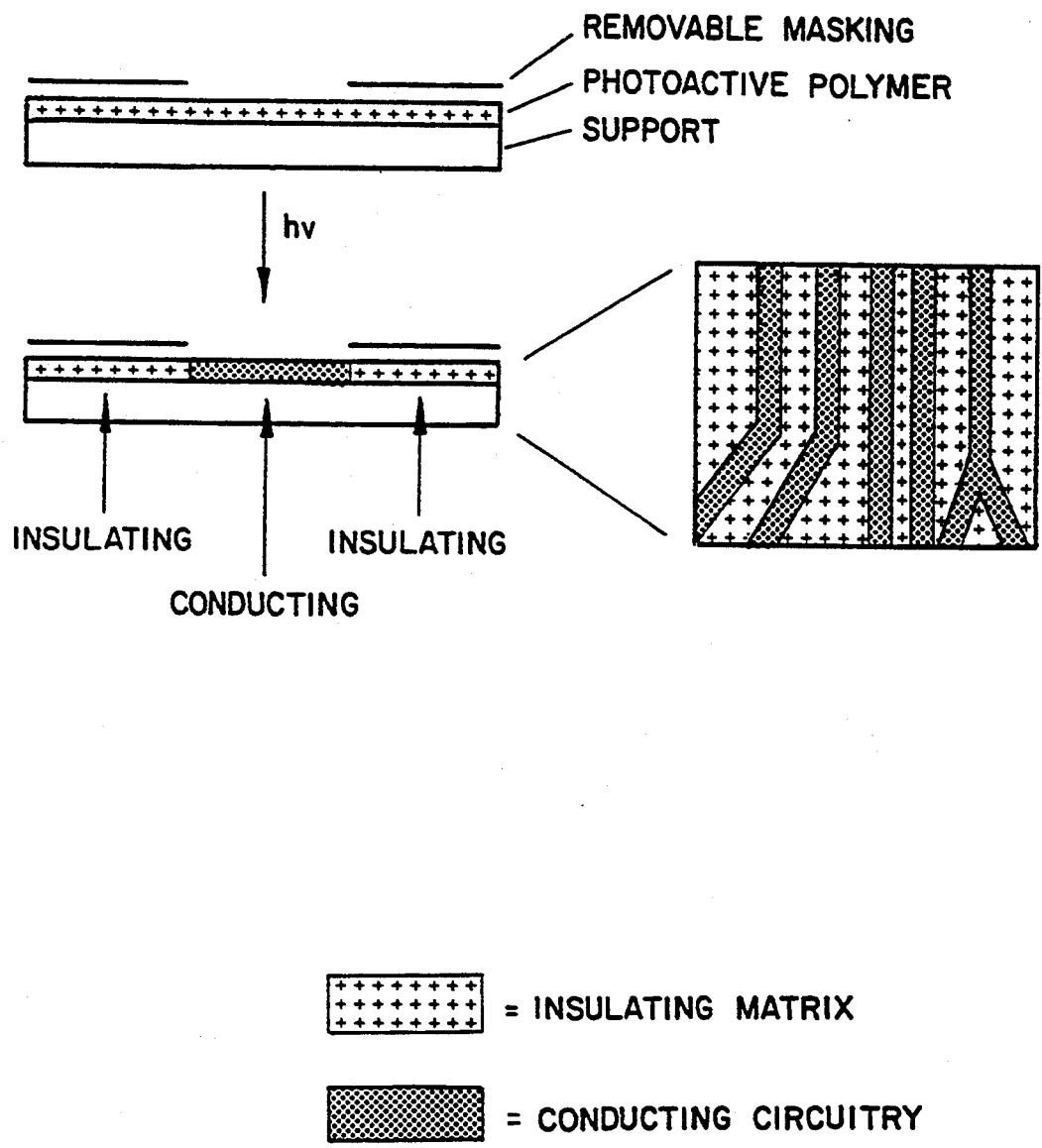
FIG. 1 is a schematic representation of semiconductor manufacture according to the present invention.

The invention will first be described regarding preferred embodiments, photoactive, arylated poly(p-phenylene sulfide) (APPS) derivatives (The term PPPS is used interchangeably, referring to phenylated poly(p-phenylene). These are synthesized through the direct arylation of preformed poly(p-phenylene sulfide) (PPS). When thin films of APPS are masked (regions protected from light), then photolyzed in the absence of hydrogen atom donors, the photolyzed regions become permanently conducting while the nonphotolyzed (masked) regions remain insulating. This unique attribute in combination with modern lithographic techniques, allows indelible, high resolution, electrically conducting circuitry and images to be imprinted directly into a polymeric film. This technique is illustrated in FIG. 1.

PPS can be phenylated at the sulfur centers by allowing the polymer to react with diaryliodonium salts (Equation 1).

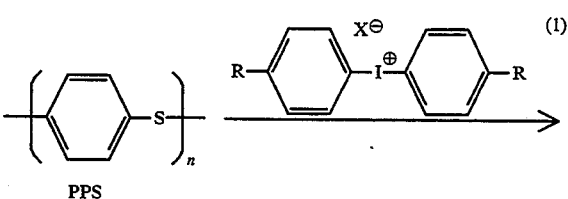

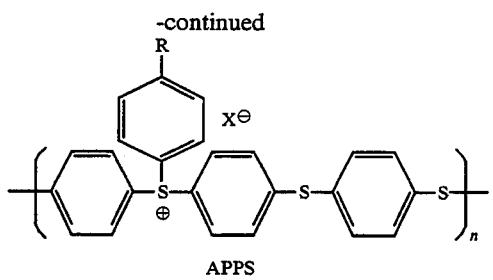

APPS

Based on the known chemistry of triaryl sulfonium salts, upon photolysis, these materials undergo a photochemical rearrangement which result in a change in their character from polar (ionic) to nonpolar and hence allow them to act as a photoresist materials (Equation 2).

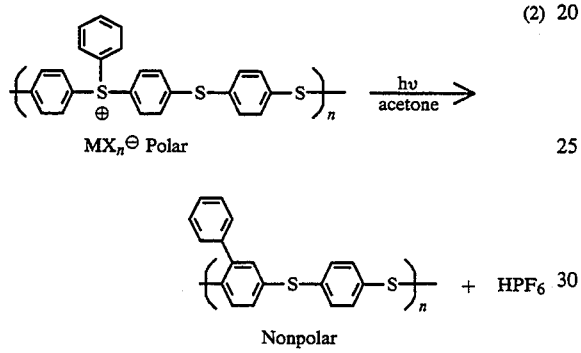

More importantly, one of the intermediates involved in the photo-decomposition process shown in Equation 2, has the same electronic structure as does the known conducting polymer derived from the doping of PPS with powerful oxidizing agents (Scheme I). Thus, the photolyzed regions of our polymer is converted from an insulator to a conductor if ways of "trapping-out" this electronic structure could be devised.

Scheme I

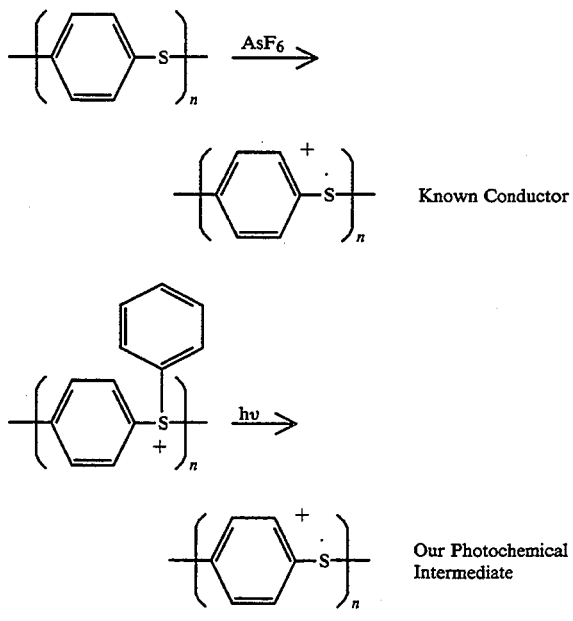

In order to "trap" out the intermediate with the proper electronic structure, the decomposition cascade this intermediate would normally undergo is stopped by eliminating from the reaction all sources of hydrogen atoms (i.e., good H-atom donors). When dry thin films of these APPS materials are masked and then photolyzed, the photolyzed regions turn black and shiny and are found to be persistently conducting, while the non-photolyzed regions remain insulating. Conductivity values of greater than $10^{-2} \Omega^{-1} cm^{-1}$ can be routinely obtained using this "photodoping" process. This value is remarkably consistent with the conductivity values obtained from the moderate $AsF_5$ doping of PPS (Scheme II). Using standard microlithographic techniques, these APPS materials become our "paper" in which conducting circuitry can be directly written into it by using a laser "pencil".

These APPS materials represent a new system which for the first time bridges the gap between two exciting, but distinct areas of polymer science: photoresists and electrically conducting polymers. Using the system described above, circuit boards and semiconductor devices can be directly fashioned by masking the insulating polymer and photolyzing the exposed electrical circuit pattern. The photolyzed regions now become the circuit "wires" and the protected (masked) regions remain the insulator.

Detailed Synthesis Scheme

Alkylation of Polymers

Methylated poly(p-phenylene sulfide) was synthesized according to the following protocol. To a 100 ml round-bottom flask equipped with a condenser, magnetic stir bar, and nitrogen inlet was added 2.994 g (0.0117 mol) of poly(p-phenylene sulfide) (PPS) and 15 ml of 1-chloronapthalene. The mixture was heated to 220° C. on a high temperature oil bath until the solid had dissolved. The mixture was cooled and the residue and the stirbar were transferred into a bomb. The bomb was flushed with nitrogen and 5 ml of chloronapthalene was added, followed by 2.396 g (0.0146) of methyl trifluoromethane sulfonate. The bomb was quickly sealed and heated at 220° C. for 5 minutes, and then rapidly cooled to room temperature. The bomb was then opened and the resulting brown viscous oil was poured in 300 ml of cyclohexane. The brown solid was dissolved in acetone and precipitated by slow addition to 300 ml cyclohexane. This process was repeated. The polymer was dissolved in acetone and precipitated by slow addition to 500 ml of 2-propanol. This process was repeated two times. The polymer was then dissolved in acetone precipitated from 500 ml of diethyl ether. The volatiles were removed in vacuo yielding 0.852 g (41%) of a tannish white solid. Note that since the exact molecular formula of this polymer is not known, the calculated elemental analysis is based on a 37% substitution level as calculated from $^1H$ integration. $^1H$ NMR (d6-acetone): $\delta 3.85$ (br, 3), 7.10–8.20 (br, 11); $^{13}C$ NMR (d6-acetone): $\delta 125.1, 238.3, 134.6, 134.8, 135.4, 136.3, 136.4, 136.5, 136.7, 136.9, 137.7, 138.1, 140.8$; $^{19}F$ NMR (d6-acetone) $\delta 10.7$; IR (NaCl): 3100, 3060, 2960, 1715, 1580, 1490, 1270, 1170, 820 cm$-1$. Analysis calc'd for: C, 47.95; H, 3.05; found: C, 48.71; H, 3.03.

Other alkylated PPS derivatives can be prepared by using the corresponding alkyl trifluoromethane sulfonate derivative (for example, ethyl trifluoromethane sulfonate, benzyl trifluoromethane sulfonate, n-propyl trifluoromethane sulfonate, etc.).

Arylation of Polymers

These polymers are synthesized through the reaction of commercial PPS with various diphenyl iodonium salts at high temperature. PPS is dissolved in chloronaphthalene (other solvents, such as diphenyl ether and N-methylpyrrolidinone may also be used) at elevated temperatures (i.e., above 200°-220° C.). Below this temperature, the parent PPS is insoluble. Polymer concentrations between 15% and 25% by weight have been used. The hot, homogeneous polymer solution is then allowed to react with diaryliodonium salts (Equation 3).

of the diaryliodonium salts varies depending upon the substituent on the aryl rings. This will also be a factor in determining the degree of substitution obtainable in these systems.

Preliminary photolysis studies on these PPPS materials have been carried out. The results are explained based on what is known concerning the photochemistry of small model compounds. Upon photolysis, triphenylsulfonium salts decompose to give aryl radical addition products and protic acids (Equation 4).

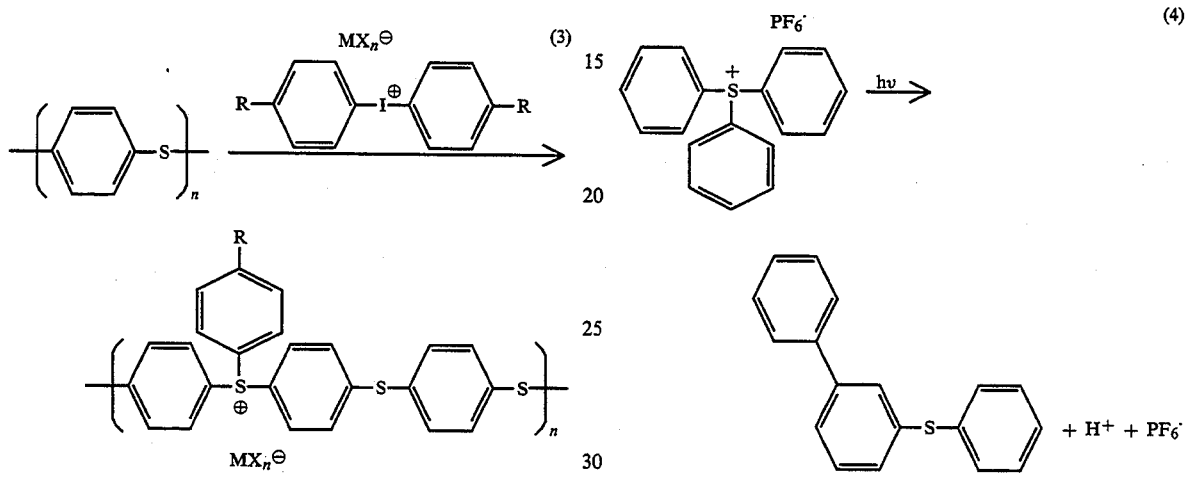

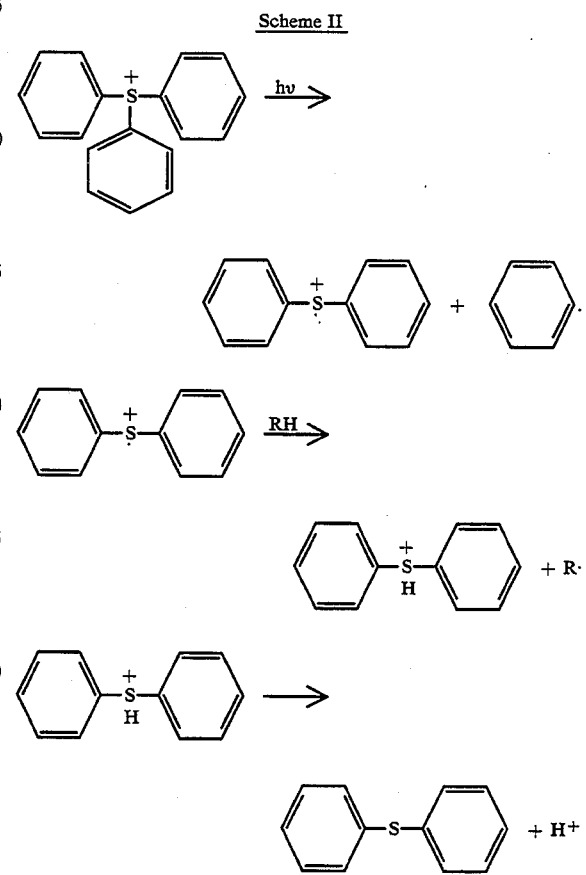

$MX_n^- = BF_4^-, PF_6^-, AsF_6^-, SbF_6^-,$ etc.

Specifically arylated poly (p-phenylene sulfide) was prepared by adding solid diphenyliodium hexaflourophospate (5.92 g, 13.9 mmol) to a solution of PPS (1.494 g, 13.81 meq.) in chloronaphthalene (22.6 Ml) at 224 ° C. under a slow stream of nitrogen. After 14 min. the solution was cooled to 55° C. and acetone (100 Ml) was added to dissolve the black residue. Addition of methanol (167 Ml) and ether (200 Ml) precipitated the polymer as a dark brown film. After six precipitations of the polymer from acetone with $Et_2O$ light tan arylated-poly(phenylene sulfide) (2.148 g, yield calculation is not possible) was obtained. $^1H$ NMR (400 Mhz, acetone-$d_6$) $\delta 8.21$-7.37 (br m). $^{13}P$ NMR (162 Mhz, acetone-$d_6$) $\delta$-142.94 (heptet, 705.18). IR 610.2, 846.5 cm$^{-1}$.

A number of factors act to influence the important properties of the APPS polymers of this invention. Properties such as solubility, crystallinity, film quality and photosensitivity appear to be dependent upon such variables as the degree of substitution along the polymer backbone, the type and position of the substituents placed on the aryl ring and the counterions present. We are currently studying the influence of each of these individual factors. A variety of substituted phenyl groups may be used in this reaction. We have to date prepared the polymers where R=H, and tert-butyl, and are now in the process of synthesizing a number of the precursor substituted diaryliodonium salts in order to prepare PPPS materials with various donor and acceptor groups attached. It is anticipated that substituents on the aryl rings will influence the photochemistry of the resultant sulfonium polymers.

It appears that the degree of substitution along the PPS backbone can be varied by controlling the amount of diaryliodonium salt reacted with the polymer. We are currently investigating these limits. The reactivity The mechanism of this reaction is shown in Scheme II.

-continued
Scheme II

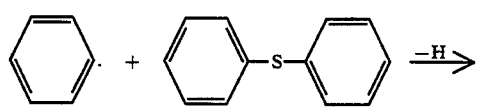

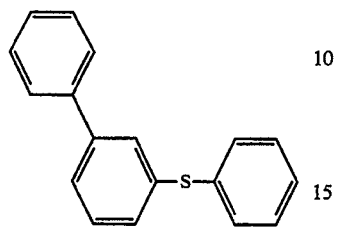

etc.

In the above example, the net result is to transform a water-soluble organic salt into a water-insoluble organic molecule through liberation of an inorganic acid.

The PPPS cationic materials were prepared as described above. Polymer I, prepared by the formal addition of phenyl $PF_6{-}$ to PPS (degree of substitution currently unknown) is soluble in acetone. We believe that by increasing the degree of substitution (adding greater numbers of charges), incorporating functionalized phenyl groups and changing the counterion, the solubility range of these substituted polymers will increase. Under the right choice of conditions, water soluble polymers can be prepared in this fashion. When I is photolyzed in acetone solution (quartz or Pyrex tubes using a mercury vapor lamp), a precipitate forms in less than 15 minutes. Unlike I, the new polymer, II, is insoluble in acetone. Based on the observed solubility, NMR results and the small molecule studies, we tentatively assign polymer II the structure shown in Equation 5.

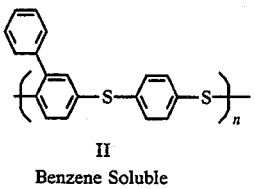

(5)

I
Acetone Soluble

II
Benzene Soluble

Photolysis of I can also be carried out in thin films. After photolysis of the solid state polymer, the unexposed area is soluble in acetone, while the exposed area becomes insoluble.

This basic chemistry can be used in the design of new photoresists. Thin films of the phenylated PPS materials can be formed and masked. After photolysis, either positive or negative resist images can be fashioned, depending on the choice of washing solvent. It is anticipated that the photolyzed regions can be removed by washing with organic solvents to form positive resists. Alternatively, washing with acetone (and potentially water) removes the nonphotolyzed regions forming negative resists.

It is believed that alternative photochemical reactions may also be used. In the photolysis of triphenylsulfonium hexfluorophosphate, one of the three equivalent sulfur-phenyl bonds undergoes homolytic cleavage. In the sulfonium centers of the PPPS polymers, however, there are two equivalent aryl-sulfur bonds along the polymer chain and one unique sulfur-aryl bond. In addition to the previously described homolytic cleavage of the unique aryl-sulfur bond, there also exists the possibility of chain scission in these PPPS materials (Equation 6).

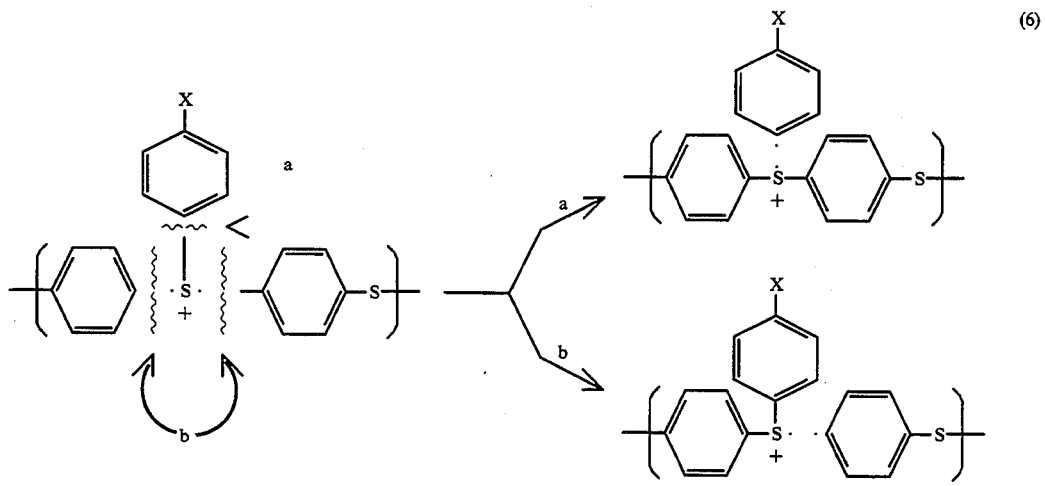

(6)

Derivatives may also be synthesized with X-substituents in the para-position of the unique phenyl group in order to either stabilize or destabilize the incipient phenyl radical. The results obtained in this study should allow us to select between path "a" (stabilized case) or pathway "b" (destabilized case), thereby controlling the amount of chain scission which occurs. It is important to remember that chain scission to lower molecular weight fragments is also a viable pathway toward photoresist materials.

One alternative is the use of PPS derivatives with substituents placed along the phenyl groups of the polymer backbone. When phenylated to form the charged sulfonium polymers, these substituted derivatives may well have improved solubility and photochemical properties.

It is known that the parent PPS polymer can be oxidized (p doped) with strong oxidizing agents to form conducting polymeric materials (PPSox). Conductivities near $1\ \Omega^{-1}\mathrm{cm}^{-1}$ are routinely obtained using $AsF_5$ as the oxidant. The oxidation process can be viewed as the removal of one electron from the lone-pair orbitals located on the sulfurs to form radical cations. These radicals are free to migrate down the polymer chain where recombination can occur. This process leaves two positive charges (bipolaron) which then becomes the conducting species (Equation 7).

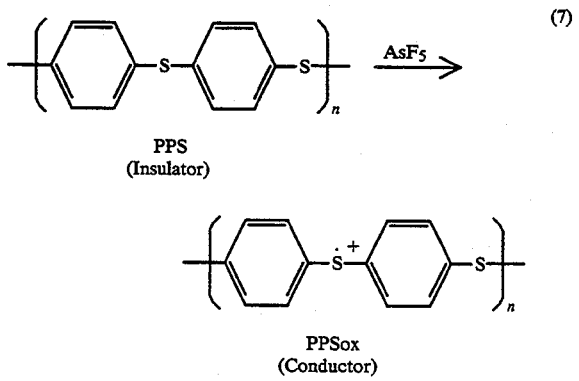

(7)

This one electron oxidized form, PPSox, is the same species which is generates by the removal of a phenyl radical upon photolysis of our sulfonium PPPS materials (Equation 8).

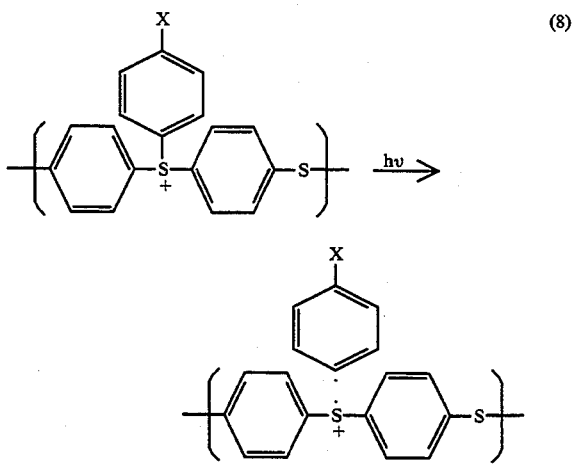

(8)

Our approach is to conduct the photolysis of our PPPS derivatives under conditions in which we can quench the reaction following the initial homolytic cleavage which liberates the phenyl radical shown in Equation 8. Doing so gives us the same material as that generated by the oxidation of the parent PPS (Equation 7). In order to inhibit any of the subsequent steps in the photochemical process (see Scheme I), it is preferable to: (1) eliminate any hydrogen atom donor source (RH in Scheme I) and (2) trap the phenyl radical before it recombines or adds to the phenyl groups of the PPS backbone. Elimination of a hydrogen donor source is easily accomplished by carrying out the photochemistry on solid, thin films in the absence of solvent. Eliminating the phenyl radical may include the addition of a radical trap which will combine with the reactive phenyl radical but leave the delocalized sulfonium radical cation untouched. A number of radical traps may be used for this purpose, e.g., molecular iodine included in the polymer films. ($I_2$ is known to react extremely rapidly with phenyl radicals.)

Thin films of polymer I were prepared by casting films from acetone solutions. The addition of iodine was accomplished by including the iodine in the acetone/polymer solutions before casting. Preliminary conductivity measurements were performed by measuring the resistance of the films. Appropriate control experiments were performed. Pristine PPS films are known to be nonconducting. Before and after photolysis, our sulfonium PPPS/$I_2$ films were found to be nonconducting. After photolysis under a dry, inert atmosphere ($N_2$), PPPS/$I_2$ films were converted to conducting materials. Our working hypothesis is that the photolysis proceeds as shown in Equation 6, with the $I_2$ acting to trap the phenyl radical, leaving only the "photodoped" PPSox conductor (Equation 9).

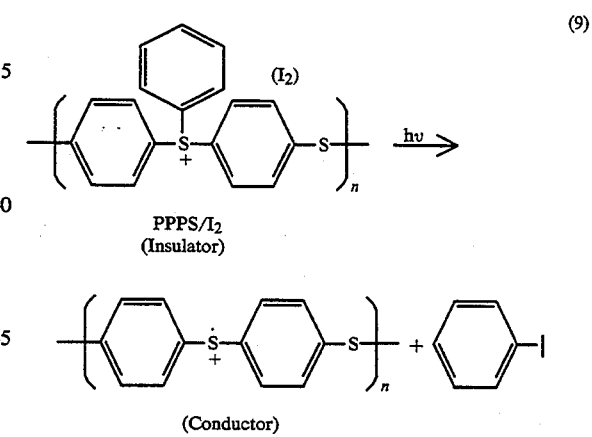

(9)

When regions of the PPPS/$I_2$ films are masked (protected from light) before photolysis, the exposed portions of the film are found to be conducting, while the masked (nonphotolyzed) regions remain insulators (FIG. 1).

The polymer need not be a film to possess both electronically conductive and electrically insulating properties. The properties can also coexist in block forms of the polymer. However, the conductive properties of the block will depend on the depth of the polymer penetrated by the light.

Other polymeric derivatives which should offer intrinsically high conductivities may also be synthesized. As mentioned above, PPS undergoes considerable chemical modification upon reaction with excess $AsF_5$ (Equation 9). The high conductivity of this material is attributed to the formation of dibenzylthiophene units along the backbone. Polymer III containing phenylated dibenzylthiophene units analogous to Polymer I may be synthesized as in Equation 10.

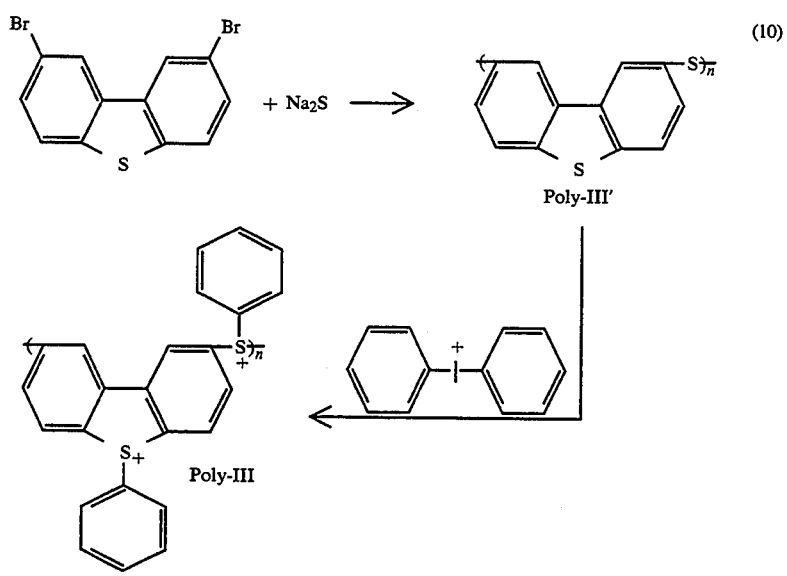

The synthesis of the neutral, precursor polymer, Polymer III', has been reported (Shacklette, L. W., R. L. Elsenbaumer, R. R. Chance, H. Eckhardt, J. E. Frommer and R. H. Baugman, *Chem. Phys.* 1981, 75 1919). As the conductivity of this structurally modified PPS is orders of magnitude greater than unmodified PPS, the same increase in the photolyzed Polymer III system should occur. We have synthesized the sulfonium model compound, III, and have shown that it undergoes the same basic photochemistry as does compound I (Equation 11).

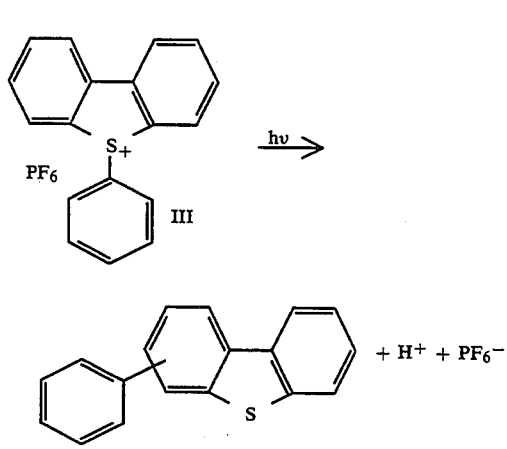

We believe that phenylation of the dibenzylthiophene polymer, Polymer III', is expected to occur on both the thiophene moiety and the sulfide moiety. Preliminary competition experiments that we conducted indicate that both moieties are phenylated under the pertinent reaction conditions. Photolysis of either, both of these sulfonium centers should give a highly conducting material.

Poly(vinylene sulfide) (PVS), a soluble polymer, may be synthesized through the condensation of trans-1,2-dichloroethylene and sodium sulfide (Equation 12).

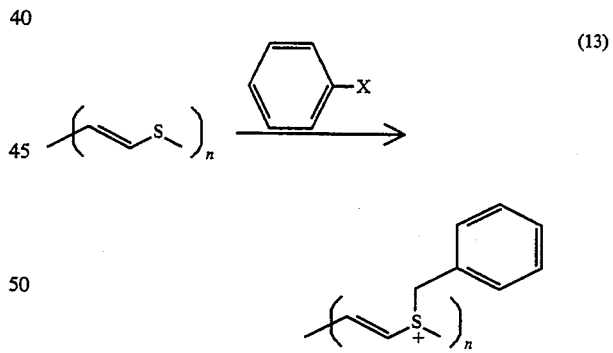

PVS is known to be mildly conducting ($7.9 \times 10^{-4}$ $\Omega^{-1}\text{cm}^{-1}$) upon oxidizing with $I_2$. It is believed that this low conductivity value is due to the fact that, like PPS, PVS has a high ionization potential (5.6 eV), and therefore requires a stronger oxidizing agent than $I_2$ to effectively convert it into a good conductor. (PPS has a conductivity of only ca. $10^{-7}\ \Omega^{-1}\text{cm}^{-1}$ when oxidized with $I_2$.) The synthesis of substituted PVS sulfonium derivatives is proposed (Equation 13).

If the chain scission process is more competitive during the photolysis of these PVS materials, the phenyl substituents can be replaced with benzyl groups as described above. Since this photodoping method of oxidizing the polymer circumvents the problems associated with the high ionization potential of PVS, highly conductive materials may be obtained in this fashion under extremely mild conditions. Photolysis of these sulfonium PVS materials should result in the formation of radical cations on these delocalized chains. Especially desirable photo active cationic organic polymers may be derived from sulfide chains possessing a greater percentage of unsaturated centers in the backbone. The approach of using 1,4-dichlorobutadiene and sodium sulfide doubles the number of double bonds in the system. Consequently, highly unsaturated materials can be designed.

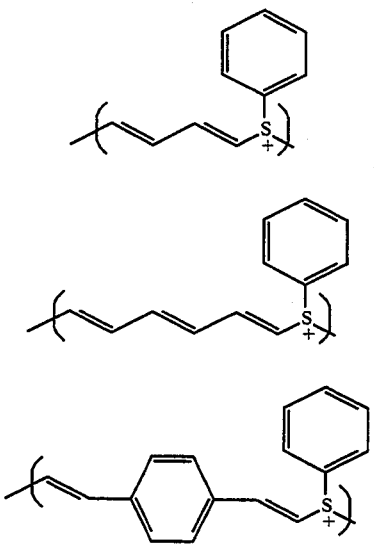

This approach allows the synthesis of polymers which appear more "polyacetylene in nature" while still maintaining sulfurs as the "photodopable" centers. Obviously, as the number of double bonds are increased, the numbers of sulfurs (photochemical doping sites) are similarly decreased, but some optimized level at which these two factors balance one another may be found. The fact that highly conductive polyacetylene can be obtained by oxidizing to a level of one positive charge per 10–20 carbon atoms, indicates that materials with double bond to sulfur ratios of 2–5 should be viable photodoped conductors.

Polythiophenes are another class of sulfur containing polymers which can be converted to highly conductive materials upon doping (Tourillon, G., "Handbook of Conducting Polymers", T. A. Skotheim, eds., Marcel Dekker, Inc., New York, 1986, p. 293). Furthermore, polythiophenes can be made soluble (including water soluble) by substitution at the 3-position of the thiophene ring. Polythiophenes may be synthesized and subsequently converted to polysulfonium materials through arlation of the sulfurs (Equation 14).

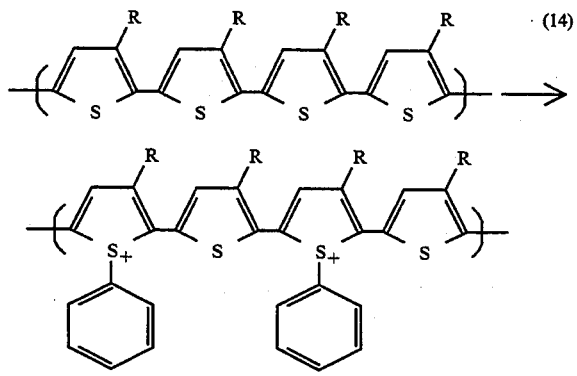

These polythiophene materials offer simplified photochemistry in that no chain scission processes are now possible. Conductivities near $10^2 \, \Omega^{-1} cm^{-1}$ can be obtained upon doping polythiophenes. Utilization of the same basic sulfonium ion photochemistry outline above in combination with alternate sulfur containing polymers, should increase the initial PPS conductivity values by at least four orders of magnitude.

The foregoing invention has been mostly described with respect to a preferred embodiment, APPS. However, it should be understood that other polymers may be employed in accordance with the present invention which can be activated in the presence of light. The preferred form of light in ultraviolet light, although it may be possible to use other forms of electromagnetic radiation such as in the visible light range.

Activation according to the invention results from a novel form of polymer in which an alkyl or aryl group is bonded to an alkyl or aryl group in accordance with the following linkage.

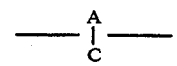

In the above linkage, the C is a chalcogenide selected from the group consisting of sulfide, selenide and telluride. A is in aryl or alkyl group. A preferable aryl group is the phenyl group while the preferred alkyl group is the benzyl group. The important feature is that the C-A linkage is capable of being cleaved in the presence of ultra violet light to release the aryl or alkyl group as a radical cation. It is believed that the presence of the radical cation in the polymer backbone causes the formerly insulating polymer to become electrically conductive. As set out above, in most instances it is important to eliminate the hydrogen atom donor source and, in some manner or other, trap the A group. One way to use this is to provide an A scavenger. However, it is believed that eventually the free radical A eventually reattaches itself to the polymer at a point other than the free radical.

Similarly derivatized polymers may be prepared based on the heavier chalcogenide analogues, poly(p-phenylene selenide) (PPSe) and poly(p-phenylene telluride) (PPTe). It is known that PPSe can be doped using $AsF_5$ to produce good conducting materials ($10^{-3}-10^{-2}\Omega^{-1}cm^{-1}$). PPTe has been shown to only be a poor conductor under similar conditions. It is postulated that this lack of conductivity in the PPTe case may be due to extensive degradation of the polymer during the doping process. It is our belief that the photolysis of arylated selenium and tellurium polymers may prove to be a much milder doping process, leading to less degradation and therefore, greater conductivity.

When dry thin films of APPS are masked off and exposed to light, or photolyzed, the exposed area becomes black and shiny. These black, shiny areas conduct electricity while the masked off areas remain insulators. In essence, the thin film becomes a microcircuit after photolyzing with no subsequent processing needs.

The semiconductor applications of these polymers render them useful as well in photocopying, photoengraving, graphic arts, and electronic photographic industries.

The conducting capacity of the photolyzed APPS is similar to that of silicon, so there is no need to use silicon wafers. The APPS films can be mounted on a variety of materials, including glass, rubber and plastics.

Since the films are transparent and ultrathin (0.25 2 microns thick), these microcircuits could potentially be coated directly on television and computer screens. Visual patters could then be created by running current directly over the screen instead of shooting electrons onto the screen as is currently done.

Electronic photography could also be conducted using these films. By reflecting light off a document and onto an APPS film—much like xerographic copiers do—a permanent image of the document could be developed. By applying a charge across the "developed" APPS film, dyes would form a pattern on the film that duplicates the document and can be transferred onto a piece of paper. Unlike xerox copiers, the image is permanent and there is no need to flash the light again each time a new copy is needed.

What is claimed is:

1. An arylated or alkylated poly(phenylene chalcogenide) polymer wherein the chalcogen is alkylated or arylated, said chalcogenide being selected from the group consisting of sulfide, selenide and telluride.

2. The polymer of claim 1 in which said chalcogenide is sulfide.

3. The polymer of claim 1 in the form of a thin film.

4. The polymer of claim 1 wherein the polymer is photoactive and electrically insulating.

5. A device having a first region comprising an arylated or alkylated cationic poly(phenyl chalcogenide) polymer which is photoactive and electrically insulating and at least a photolysed second region comprising a cationic poly(phenyl chalcogenide) polymer with radical cations along its backbone which is electronically conductive, said chalcogenide being the same chalcogenide for the conductive polymer and the electrically insulating polymer and being selected from the group consisting of sulfide, selenide and telluride, said chalcogenide in said electrically insulating polymer being arylated or alkylated.

6. The device of claim 5 in which said chalcogenide is sulfur.

7. The device of claim 5 in the form of a semi-conductor.

8. A photoactive cationic organic polymer having unsaturated chains along the polymer backbone adjacent to a cationic chalcogenide, wherein the chalcogenide is alkylated or arylated and is sulfide, selenide or telluride and the polymer is electrically insulating and is capable of decomposition upon photolysis in the absence of a hydrogen atom donor and the presence of a radical trap to yield an electrically conductive form that is a new conjugate polymer that possesses radical cations along its backbone.

9. A photoactive cationic organic chalcogenide polymer wherein the cationic charge is located on the chalcogenide which is alkylated or arylated, is sulfide, selenide or telluride and is surrounded by conjugated chains, said polymer is electrically insulating and is capable of decomposing upon photolysis in the presence of ultraviolet light, the absence of a hydrogen atom donor source and the presence of a radical trap to an electrically conductive form that is a new conjugate polymer that possesses radical cations along its backbone.

10. A photoactive cationic organic polymer having unsaturated chains, along the polymer backbone, adjacent to a cationic chalcogenide, wherein the chalcogenide is alkylated or arylated and is sulfide, selenide or telluride and the polymer is electrically insulating and is capable of photolysis in the presence of ultraviolet light, the absence of a hydrogen atom donor source and the presence of a radical trap to yield an electrically conductive form that is a new conjugate polymer that possesses radical cations along its backbone.

11. The photoactive cationic polymer of claim 10 wherein a phenyl or alkyl group of said arylated or alkylated chalcogenide is capable of being released in free radical form in the presence of ultraviolet light.

12. A method for forming an arylated poly(phenylene chalcogenide) polymer wherein the chalcogenide is sulfide, selenide or telluride, comprising the step of direct arylation of a poly(p-phenylene chalcogenide) polymer using an iodonium salt.

13. The method of claim 12 in which said direct arylation is performed by arylation with a diaryliodonium salt at the chalcogenide centers of the poly(phenylated) polymer.

14. A method for forming an alkylated poly(phenylene chalcogenide) polymer, wherein the chalcogenide is alkylated and is sulfide, selenide or telluride, comprising the step of direct alkylation of a poly(p-phenylene chalcogenide) polymer using a sulfonate salt.

15. A cationic organic polymer having unsaturated chains along the polymer backbone adjacent to a cationic chalcogenide, wherein the chalcogenide is alkylated or arylated and is sulfide, selenide or telluride.

16. A cationic organic chalcogenide polymer wherein the cationic charge is located on the chalcogenide which is alkylated or arylated, is sulfide, selenide or telluride and is surrounded by conjugated chains.

* * * * *

UNITED STATES PATENT AND TRADEMARK OFFICE
CERTIFICATE OF CORRECTION

PATENT NO. : 5,376,502
DATED : December 27, 1994
INVENTOR(S) : Novak et al.

It is certified that error appears in the above-identified patent and that said Letters Patent is hereby corrected as shown below:

Column 11, lower portion of Equation 11 (approximately line 53), please delete the "-" following "+ $PF_6$".

Signed and Sealed this

Twenty-first Day of November, 1995

*Attest:*

BRUCE LEHMAN

*Attesting Officer*     *Commissioner of Patents and Trademarks*